US010863631B2

(12) United States Patent
Stahr et al.

(10) Patent No.: US 10,863,631 B2
(45) Date of Patent: Dec. 8, 2020

(54) LAYER STACK OF COMPONENT CARRIER MATERIAL WITH EMBEDDED COMPONENTS AND COMMON HIGH TEMPERATURE ROBUST DIELECTRIC STRUCTURE

(71) Applicant: AT&S Austria Technologie & Systemtechnik Aktiengesellschaft, Leoben (AT)

(72) Inventors: Johannes Stahr, St. Lorenzen im Mürztal (AT); Timo Schwarz, St. Michael i.O. (AT); Mario Schober, Trofaiach (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/294,673

(22) Filed: Mar. 6, 2019

(65) Prior Publication Data

US 2019/0281706 A1 Sep. 12, 2019

(30) Foreign Application Priority Data

Mar. 12, 2018 (EP) .................... 18161291

(51) Int. Cl.
*H05K 1/18* (2006.01)
*H05K 3/00* (2006.01)
(Continued)

(52) U.S. Cl.
CPC ........... *H05K 3/4602* (2013.01); *H01L 21/56* (2013.01); *H01L 21/561* (2013.01);
(Continued)

(58) Field of Classification Search
CPC .......... H05K 1/183; H05K 1/18; H05K 1/182; H05K 1/186; H05K 1/187; H05K 1/188; H05K 3/0011–3/0067
See application file for complete search history.

(56) References Cited

U.S. PATENT DOCUMENTS

2002/0137263 A1  9/2002  Towle et al.
2007/0025092 A1*  2/2007  Lee ................... H01L 23/49822
                                                              361/761
(Continued)

FOREIGN PATENT DOCUMENTS

EP    1 321 980 A1    6/2003
EP    1 848 029 A1    10/2007
EP    2 068 361 A1    6/2009

OTHER PUBLICATIONS

Hubbard, Robert L., "New Material and Reliability Issues of Redistribution Layers," Lambda Technologies, Inc., Morrisville, NC, 27560.

*Primary Examiner* — Jeremy C Norris
(74) *Attorney, Agent, or Firm* — Robert A. Blaha; Smith Tempel Blaha LLC

(57) ABSTRACT

A manufacturing method, wherein the method includes providing a layer stack having at least partially uncured component carrier material, arranging a plurality of components in recesses of the layer stack, integrally connecting the components with the layer stack by curing the component carrier material, and applying a high temperature robust dielectric structure on a main surface of the cured layer stack with the components therein.

20 Claims, 5 Drawing Sheets

(51) Int. Cl.
*H05K 3/46* (2006.01)
*H01L 23/522* (2006.01)
*H01L 23/528* (2006.01)
*H01L 23/532* (2006.01)
*H01L 23/00* (2006.01)
*H05K 1/02* (2006.01)
*H05K 1/11* (2006.01)
*H05K 3/40* (2006.01)
*H01L 21/56* (2006.01)

(52) U.S. Cl.
CPC ........ *H01L 21/568* (2013.01); *H01L 23/5226* (2013.01); *H01L 23/5283* (2013.01); *H01L 23/5329* (2013.01); *H01L 24/09* (2013.01); *H01L 24/17* (2013.01); *H01L 24/19* (2013.01); *H01L 24/96* (2013.01); *H01L 24/97* (2013.01); *H05K 1/0298* (2013.01); *H05K 1/112* (2013.01); *H05K 1/181* (2013.01); *H05K 1/185* (2013.01); *H05K 3/4038* (2013.01); *H05K 3/4682* (2013.01); *H01L 2223/54493* (2013.01); *H01L 2224/0231* (2013.01); *H01L 2224/02373* (2013.01); *H01L 2224/02379* (2013.01); *H01L 2224/02381* (2013.01); *H01L 2224/04105* (2013.01); *H01L 2224/06181* (2013.01); *H01L 2224/12105* (2013.01); *H01L 2924/10253* (2013.01); *H01L 2924/14* (2013.01); *H01L 2924/18162* (2013.01); *H01L 2924/3511* (2013.01); *H01L 2924/35121* (2013.01); *H05K 3/0052* (2013.01); *H05K 3/0097* (2013.01); *H05K 2201/0154* (2013.01); *H05K 2201/10378* (2013.01); *H05K 2203/025* (2013.01); *H05K 2203/166* (2013.01)

(56) References Cited

U.S. PATENT DOCUMENTS

| | | | |
|---|---|---|---|
| 2008/0296056 A1* | 12/2008 | Kinoshita | H01L 23/13 174/261 |
| 2012/0037404 A1* | 2/2012 | Hsu | H05K 3/4644 174/252 |
| 2013/0049205 A1 | 2/2013 | Meyer et al. | |
| 2014/0177192 A1 | 6/2014 | Lee et al. | |
| 2015/0334842 A1* | 11/2015 | Shimabe | H01L 23/49822 174/258 |
| 2017/0323840 A1 | 11/2017 | Chiu et al. | |

* cited by examiner

LAYER STACK OF COMPONENT CARRIER MATERIAL WITH EMBEDDED COMPONENTS AND COMMON HIGH TEMPERATURE ROBUST DIELECTRIC STRUCTURE

CROSS-REFERENCE TO RELATED APPLICATION

This application claims the benefit of the filing date of European Patent Application No. 18 161 291.2 filed Mar. 12, 2018, which is incorporated herein by reference in its entirety.

TECHNICAL FIELD

The invention relates to a manufacturing method, to a semi-finished product, to a component carrier, and to an electronic device.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

In particular, efficient manufacture of component carriers with components embedded in component carrier material is a challenge.

SUMMARY

There may be a need to efficiently manufacture component carriers with components embedded in component carrier material.

According to exemplary embodiments of the invention, there are provided a manufacturing method, a semi-finished product, a component carrier, and an electronic device according to the independent claims.

According to an exemplary embodiment of the invention, a manufacturing method is provided, wherein the method comprises providing a layer stack comprising at least partially uncured component carrier material, arranging a plurality of components in recesses of the layer stack, integrally connecting the components with the layer stack by curing the component carrier material, and applying a high temperature robust dielectric structure on a main surface of the cured layer stack with the components therein.

According to another exemplary embodiment of the invention, a semi-finished product is provided, wherein the semi-finished product comprises a laminated layer stack made of component carrier material, a plurality of semiconductor components arranged in recesses of the layer stack, and a redistribution layer on a main surface of the layer stack (in particular on the entire main surface of the layer stack with the embedded components) and electrically coupled with the semiconductor components.

According to still another exemplary embodiment of the invention, a component carrier is provided, wherein the component carrier comprises a semiconductor component, component carrier material at least partially surrounding the semiconductor component (in particular only in a lateral direction), and a redistribution structure entirely covering one main surface of the semiconductor component and entirely covering one main surface of the component carrier material and comprising a high temperature robust dielectric material and electrically conductive structures therein, wherein the electrically conductive structures are externally exposed and are electrically coupled with pads of the semiconductor component.

According to yet another exemplary embodiment of the invention, an electronic device is provided which comprises a mounting base (in particular a printed circuit board, PCB), and a component carrier having the above-mentioned features being mounted on and electrically coupled with the mounting base (in particular by a solder structure).

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "semi-finished product" may particularly denote a physical structure which is not yet readily manufactured but requires further processing to obtain final products which can functionally serve as stand-alone component carriers. In other words, a semi-finished product may be a pre-form of one or more component carriers to be manufactured based on the semi-finished product.

In the context of the present application, the term "at least partially uncured component carrier material" may particularly denote material which has the property to at least partially melt or become flowable by the application of elevated pressure and/or elevated temperature, and become fully hardened or cured (and thereby becomes solid) when releasing the applied elevated pressure and/or elevated temperature. Consequently, applying elevated pressure and/or elevated temperature may cause melting of the curable or at least partially uncured material, followed by an irreversible hardening (in particular by cross-linking) upon releasing the applied high pressure and/or high temperature. In particular, the "at least partially uncured material" may comprise or consist of B-stage material and/or A-stage material. By providing the layer stack with prepreg or any other B-stage material, at least a portion of the layer stack may re-melt during lamination so that resin (or the like) may flow for interconnecting the various elements and for closing gaps or voids and may therefore contribute to a stable intrinsic interconnection within the component carrier(s) being manufactured.

In the context of the present application, the term "high temperature robust dielectric structure" may particularly denote a structure, in particular a layer, of electrically insulating material to be attached, in particular laminated, on a cured component carrier layer stack with embedded components and being thermostable at least up a temperature of 250° C., in particular at least 300° C., more particularly at least 350° C. without being harmed or destroyed. In particular, examples for such temperature stable dielectric materials suitable for forming a redistribution layer to be connected (in particular laminated) to a stack of component carrier material are certain polyimides (in particular aromatic polyimides, having a particularly pronounced thermostability) or other polymeric or organic dielectric films showing this high temperature stability or high heat resistance. For example, a high temperature robust dielectric structure may have a high glass transition temperature (Tg) of 300° C. or more. Appropriate materials which can be used for the high temperature robust dielectric structure are for example Polybenzoxazole (PBO), Benzocyclobutane (BCB), cyanate ester as well as blends with high temperature epoxy materials.

In addition, the high temperature robust dielectric structure can improve the rigidity of the component carrier so that warpage and stress of the component carrier can be suppressed. If the high temperature robust dielectric structure forms part of a redistribution layer, the redistribution layer has an improved rigidity. A high rigidity and a high coefficient of thermal expansion (CTE) result to reduced stress and warpage.

In the context of the present application, the term "redistribution layer" may particularly denote a layer with a dielectric matrix and an electrically conductive structure formed therein. Such a redistribution layer may form an electric and mechanical interface between smaller dimensions of pads of components (in particular electronic components, more particularly semiconductor chips) and larger dimensions of external electric contacts of a mounting base (for instance a printed circuit board, PCB) or the like. In other words, the small dimensions of the component (in particular chip) world are transferred by the redistribution layer into the larger dimensions of the world of a mounting base (such as a printed circuit board) on which the component carrier may be mounted.

According to an exemplary embodiment of the invention, an architecture of manufacturing component carriers with embedded components is provided in which the components are embedded in recesses of an at least partially uncured stack of component carrier material. By curing the stack material, it becomes possible to integrally connect the components with the stack. Since many components may be embedded in the stack on panel level (or artificial wafer level), a highly efficient high throughput manufacturing method is provided which also allows the formation of a redistribution layer on panel level (or artificial wafer level). More generally, a dielectric structure may be formed on such a semi-finished product in form of a laminated stack of component carrier material with embedded components. Such a dielectric layer, which may for example form part of a common redistribution layer on panel level (or artificial wafer level), may be advantageously made of a high temperature robust dielectric material. Such high temperature robust dielectric materials are highly advantageously compatible with lamination technology related component carrier board materials (such as epoxy resin, glass fibers, prepreg, FR4), while being not or being significantly worse compatible with mold compounds. By this opportunity of implementing high temperature robust dielectric materials (in particular for manufacturing a fan-out frame) as a result of the use of component carrier material rather than mold compound material, temperature robustness of the manufactured component carriers is increased during the manufacturing process and any damage of the dielectric structure (in particular redistribution layer) can be reliably prevented. In particular, such a thermostable dielectric structure may be capable of undergoing a subsequent temperature critical process like laser drilling process and/or a reflow soldering process. Conventional issues concerning warpage or delamination are thereby significantly relaxed.

In the following, further exemplary embodiments of the method, the semi-finished product, the component carrier, and the electronic device will be explained.

In an embodiment, the method further comprises forming a redistribution layer on the (preferably the entire) main surface of the layer stack and the components at which the high temperature robust dielectric structure is arranged, wherein the high temperature robust dielectric structure forms part of the redistribution layer. Thus, a high temperature stable redistribution layer may be formed on the laminate-type layer stack with embedded components. This temperature robustness of the dielectric material of the redistribution layer being compatible with lamination technology promotes a tendency of suppressing delamination and other undesirable effects of a component carrier, both during manufacture and operation.

In an embodiment, the method further comprises forming electrically conductive structures (for instance made of copper) in the high temperature robust dielectric structure of the redistribution layer and electrically connecting the components with an exposed surface of the redistribution layer. For instance, such electrically conductive structures may be formed in a single layer or preferably a multi-layer dielectric structure by patterning a respective dielectric layer (for instance by laser drilling involving relatively high temperatures without harming the redistribution layer, mechanical drilling, photolithography) and filling formed recesses with electrically conductive material (for instance by plating, electroless deposition, galvanization, etc.).

In an embodiment, the high temperature robust dielectric structure is applied on the main surface of the layer stack and the components by one of the group consisting of spin coating, spray coating, roller coating, slot die coating, and attaching a dry film. In particular spin coating is an appropriate method of forming a high temperature robust dielectric structure, for instance of a polymeric material. Spin coating is a procedure used to deposit a uniform thin film of high temperature robust dielectric material to a flat layer stack with embedded components. For this purpose, a certain amount of coating material may be applied on the center of the layer stack, which is spinning at a certain speed or is not spinning at all. The layer stack is then rotated at higher speed in order to spread the coating material by centrifugal force. For forming the high temperature robust dielectric material on the layer stack by spin coating, it is advantageous to provide the layer stack in a circular disk shape before spin coating. In other embodiments, the high temperature robust dielectric material is formed by another process, for instance by laminating a dry film. The latter procedure is compatible with any shape of the layer stack, for instance also with a rectangular shape.

In an embodiment, the component comprises a semiconductor component or a semiconductor wafer. Preferably, naked (i.e. non-encapsulated) dies or chips are embedded in the layer stack. This results in highly compact component carriers with integrated electronic functionality. Embedding an entire wafer or wafer section is a further option.

In an embodiment, the method comprises forming the layer stack with component carrier panel size, in particular with a size in a range of at least 12×12 inch$^2$ up to 24×24 inch$^2$. The layer stack may hence have a rectangular cross-section. Thereby, the vast majority of manufacturing processes for forming the component carriers may be advantageously carried out by executing standard PCB manufacturing processes. If desired for certain procedures (for instance spin coating for forming a highly thermally robust dielectric layer), cutting a rectangular panel into a circular disk like flat shape is possible. Thus, the method may further comprise separating a circular section from the layer stack, in particular before forming the high temperature robust dielectric structure.

In an embodiment, the method further comprises forming the recesses by at least one of the group consisting of milling, laser cutting, punching, and drilling. Also a fully cured plate-shaped body may be provided with already pre-cut recesses.

In an embodiment, the method further comprises attaching a temporary carrier on a main surface of the layer stack, and subsequently inserting the components in the recesses and attaching them onto the temporary carrier. In an embodiment, the temporary carrier comprises a sticky surface facing the component carrier material and the recess or cavity. Providing the temporary carrier with a sticky surface simplifies connection of the temporary carrier on the component carrier material, in particular a core having a through-hole, closed by the temporary carrier. In an embodiment, the temporary carrier comprises a rigid plate. It is advantageous that the temporary carrier has a rigid plate providing the semi-finished product still including the temporary carrier with additional stability during a lamination procedure by which further layers are built up. However, as an alternative to a rigid plate (preferably having a sticky upper surface), it is also possible that the temporary carrier is a sticky foil being flexible.

In an embodiment, the method further comprises removing the temporary carrier after curing the at least partially uncured component carrier material. Since after curing, the previously uncured material has been cured and hardened, the provision of mechanical support by the temporary carrier may be dispensable after completion of the lamination and curing procedure. For instance, the temporary carrier may be simply peeled off from the semi-finished product after lamination.

In an embodiment, the method comprises providing an at least partially uncured layer which is covered on both opposing main surfaces with fully cured material as partially uncured layer stack. In this context, the term "fully cured" may particularly denote a material property according to which the corresponding material (such as resin) is not capable any more of being re-melted to become flowable and of being subsequently re-solidified. Such resin material may be already cross-linked. Thus, the fully cured material may be C-stage material rather than A-stage or B-stage material. By taking this measure it can be ensured that the corresponding constituent of the layer stack itself does not lose its supporting function or change its position during the connection procedure (in particular a lamination procedure which may involve increased pressure and/or increased temperature), so that high positional accuracy may be ensured. In contrast to this, the at least partially uncured material of the layer stack may melt or become flowable during lamination and may thereby contribute to the interconnection between the individual constituents of the component carrier and may also flow in tiny gaps between the layer stack and the components.

In an embodiment, curing is accomplished by laminating, in particular by the application of at least one of mechanical pressure and thermal energy. Thereby, curing of the previously uncured material provides adhesive forces holding the individual constituents of the layer stack together. At the same time, lamination mechanically hardens the uncured material, thereby forming a rigid structure.

In an embodiment, the method comprises filling gaps between a respective component and a recess delimiting wall of the layer stack by material of the layer stack being cured during the curing. By melting or rendering the uncured material flowable during lamination prior to final re-solidification of the then cured material, the temporarily flowable resin automatically flows into the mention gaps, fills these gaps or voids partially or entirely, and therefore contributes to the formation of a component carrier with reliable and reproducible interior properties.

In an embodiment, the method further comprises thinning at least one of the components and the layer stack after the curing. For instance, thinning may be accomplished by mechanically grinding. Additionally or alternatively, thinning may also be carried out by a chemical etching process or by laser processing.

In an embodiment, forming the high temperature robust dielectric structure is carried out before or after the thinning. This provides an engineer with a high degree of flexibility.

In an embodiment, the method further comprises singularizing the layer stack with the inserted components and the high temperature robust dielectric structure (in particular the redistribution layer comprising the high temperature robust dielectric structure) thereon into a plurality of component carriers. Singularization or separation of the panel level or artificial wafer level semi-finished product into individual component carriers may for instance be accomplished by mechanically sawing, laser cutting, or chemically etching. Each separated or singularized component carrier may comprise at least one of the components, a portion of the layer stack and a portion of the redistribution layer.

In an embodiment, the method further comprises embedding each of the component carriers in further component carrier material. In such an embodiment, the component carrier with embedded component may be considered as a larger component which, in turn, can be embedded in another still larger component carrier. Thereby, it is possible to form a board-in-board device (compare for example FIG. 12).

In an embodiment, the method further comprises embedding the layer stack with the inserted components and the high temperature robust dielectric structure into a mounting base, in particular a printed circuit board, wherein the method further comprises applying at least one further layer on the redistribution layer, in particular with embedding a further component into the at least one further layer.

In an embodiment, the method further comprises forming at least one vertical through connection extending between two opposing main surfaces of and through the component. In an embodiment, the method further comprises applying another high temperature robust dielectric structure on another main surface of the cured layer stack and forming another redistribution layer on the other main surface at which the other high temperature robust dielectric structure is arranged, wherein the other high temperature robust dielectric structure forms part of the other redistribution layer. Thereby, the component carrier can be designed more compact or flatter. The other high temperature robust dielectric structure further improves the rigidity.

In an embodiment, the method further comprises embedding another component in the other redistribution layer.

In an embodiment, the redistribution layer comprises a high temperature robust dielectric material (such as a polymeric material like thermostable polyimide, preferably aromatic polyimide with pronounced thermostable properties). For instance, such a dielectric material may have a glass transition temperature, a curing temperature, and/or may withstand temperatures of at least up to 250° C., in particular of at least up to 300° C., more particularly of at least up to 350° C. The use of highly thermostable dielectric redistribution layer material improves the reliability of the component carrier even in the presence of high temperatures during manufacture and/or operation of the component carrier.

In an embodiment, the redistribution layer comprises an electrically conductive structure having electrically conductive areas on an exposed surface of the redistribution layer which areas are larger than areas of pads of the semiconductor components. Therefore, it becomes possible to manufacture the component carrier in a compact way with small components and pads with a small pitch, while at the same time ensuring sufficiently large distances between adjacent electrically conductive areas on the exposed surface. This allows conveniently forming a reliable electric connection (in particular by soldering) with a mounting base of larger lateral dimensions (such as a PCB).

In an embodiment, the semiconductor components are bare dies each with at least one integrated circuit element monolithically integrated therein. By embedding unpackaged silicon chips in the component carrier material, a highly compact component carrier may be obtained. However, it is alternatively also possible to embed already packaged semiconductor chips or semiconductor chips mounted on a (for instance ceramic) carrier as component in the component carrier material.

In an embodiment, exposed main surfaces of the component carrier material and of the semiconductor component are aligned so as to form a common planar area. This allows manufacturing the component carrier flat and compact and avoids the formation of steps between component carrier material and component.

In an embodiment, the redistribution structure is configured for electrically connecting the semiconductor component with a fan-out layout or in a fan-out fashion. In other words, the redistribution structure spatially spreads the smaller pad sizes and/or smaller pad distances at the connection surface of the component to obtain larger pad sizes and/or larger pad distances at an external connection surface of the redistribution structure facing a mounting base. As an analogue to such a fan-out layout, a user may hold out the hand and spread the fingers apart. In this position, the fingers are fanned out from the palm. The fan-out layout may be such that the maximum lateral distance between outermost portions of the electrically conductive structure at an exterior surface of the redistribution structure of the component carrier is larger than a lateral dimension of the embedded component.

The mentioned component and optionally at least one further component may be embedded in the component carrier. A further component may also be surface mounted on the component carrier. A component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna structure, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite coupling structure) or may be a paramagnetic element. However, the component may also be a further component carrier, for example in a board-in-board configuration. The component may be surface mounted on the component carrier and/or may be embedded in an interior thereof. Moreover, also other components may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In an embodiment, at least one further layer is applied on the redistribution layer, in particular with a further component embedded therein.

In an embodiment, at least one vertical through connection extends between two op-posing main surfaces of and through the component.

In an embodiment, another high temperature robust dielectric structure is applied on another main surface of the cured layer stack, and another redistribution layer is formed on the other main surface at which the other high temperature robust dielectric structure is arranged, wherein the other high temperature robust dielectric structure forms part of the other redistribution layer.

In an embodiment, another component is embedded in the other redistribution layer.

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as rein-forced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type body. In such an embodiment, the component carrier is a compound of multiple layer structures which are stacked and connected together by applying a pressing force, if desired accompanied by heat.

In an embodiment, the electronic device comprises a mounting base, in particular a printed circuit board; a component carrier as described above and embedded in and electrically coupled with the mounting base, in particular by a solder structure, thermal compression bonding or another appropriate process.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
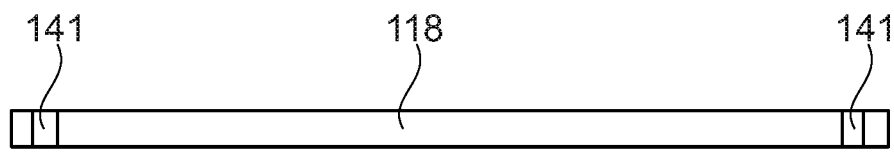
FIG. 1, FIG. 2, FIG. 3, FIG. 4, FIG. 5, FIG. 6, FIG. 7 and FIG. 8 illustrate cross-sectional views of structures.

The illustrations in the drawings are schematically presented. In different drawings, similar or identical elements are provided with the same reference signs. The invention will be described in more detail hereinafter with reference to examples of embodiment but to which the invention is not limited.

Before, referring to the drawings, exemplary embodiments will be described in further detail, some basic considerations will be summarized based on which exemplary embodiments of the invention have been developed.

According to an exemplary embodiment, a wafer level packaging (WLP) manufacturing architecture in component carrier technology is provided, in particular enabling the implementation of high temperature resistant dielectric redistribution layer material.

In a conventional wafer level packaging (WLP) process in fan-out architecture, a silicon component can be surrounded with mold material to thereby increase the surface of the component for redistribution. Subsequently, the entire surface may be covered with a redistribution layer. Since however the entire manufacturing process for such components in fan-out architecture is not compatible with the use of high temperature stable materials, heat introduction upon laser drilling may result in a damage of the redistribution layer, involving in particular the risk of delamination.

In order to overcome such conventional shortcomings, an exemplary embodiment of the invention substitutes conventional mold compound by high temperature stable printed circuit board dielectric material for manufacturing a fan-out frame, thereby enabling the use of a dielectric material for the redistribution layer being appropriate for processing at high temperatures. As a result, damage of the redistribution layer may be prevented, and the risk of delamination and warpage may be significantly reduced. By taking this matter, high temperature robust redistribution layer material may be implemented for the manufacture of (in particular silicon) components in a fan-out configuration. Consequently, thermal reliability and robustness during the manufacturing process can be increased, and as a result the risk of any damage of the redistribution layer (in particular during laser drilling processes and subsequent reflow soldering processes) may be efficiently suppressed. Also curing of the high temperature robust dielectric material of the redistribution layer may be carried out at relatively high temperature. The described manufacturing method is particularly advantageous for manufacturing a component carrier (in particular a printed circuit board) with one or more embedded components, in which a pronounced connection area can be provided by a corresponding fan-out arrangement.

In a nutshell, exemplary embodiments of the invention enable the production of component carriers with embedded components in a fan-out configuration using materials with high glass transition temperature for a redistribution layer. Correspondingly manufactured component carriers have pronounced mechanical and electric reliability during manufacture and use, and efficiently suppress any tendency of warpage, delamination or copper migration. At the same time, a fan-out layout for conveniently mounting such a component carrier on a mounting base may be formed. Since exemplary embodiments of the invention may use typical materials (such as resin, in particular epoxy resin, reinforcing particles, in particular glass fibers, and a metal such as copper) of component carrier technology (in particular printed circuit board technology) being compatible with high temperature processing, conventional issues related to the thermal stability of mold components (being stable typically only up to 220° C.) can be overcome. Furthermore, a corresponding strict temperature limitation concerning dielectric materials, forming the basis of the redistribution layer in mold compound technology, does therefore not exist for exemplary embodiments of the invention. Conventional reliability issues, in particular after reflow soldering, such as the formation of fissures, blistering and delamination, are therefore significantly relaxed in exemplary embodiments of the invention.

A gist of an exemplary embodiment of the invention is to provide a component carrier manufactured in wafer level packaging technology, however preferably using only component carrier laminate material for embedding components and a continuous redistribution layer comprising a high temperature stable dielectric material.

An exemplary embodiment combines the use of high temperature FR4 materials and chip embedding technology in order to manufacture a component carrier (in particular printed circuit board) in the shape of a wafer or on wafer level, and applies a high temperature dielectric structure on this artificial wafer. Preferably, such a high temperature dielectric structure can be cured at a high temperature of for example up to 350° C.

Figure 7:
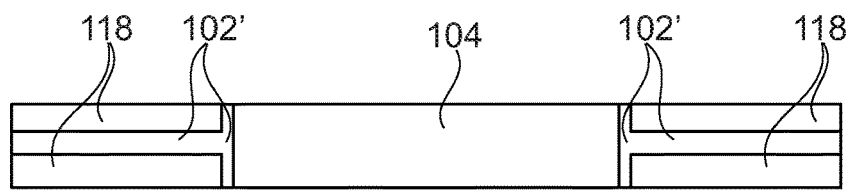
Figure 8:
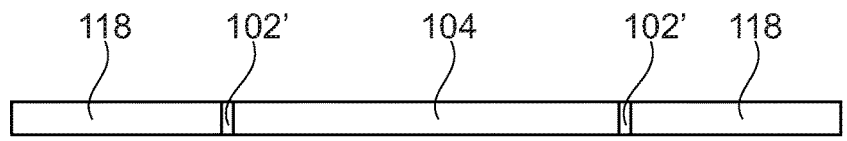
Figure 9:
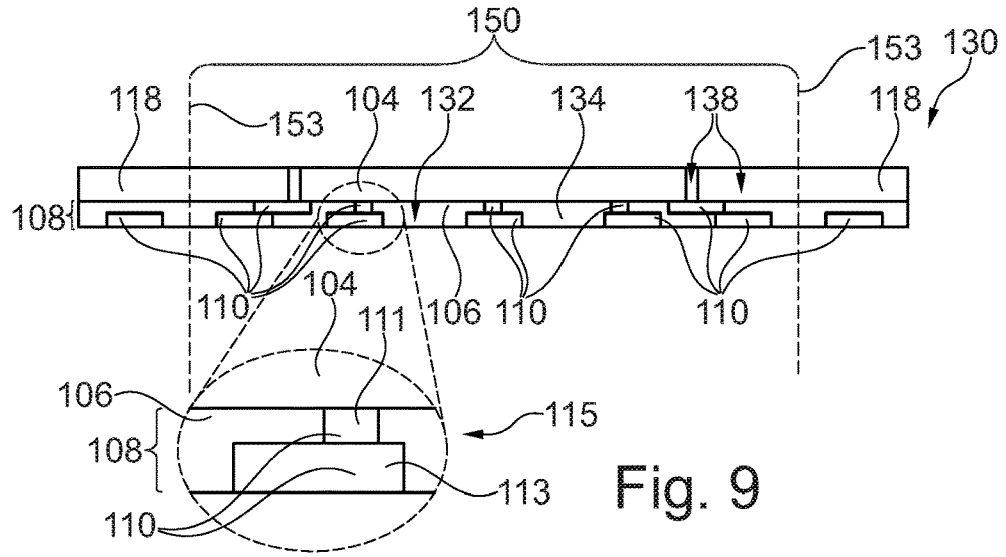
FIG. 9 illustrates a cross-sectional view of a semi-finished product obtained during carrying out a method of manufacturing component carriers according to an exemplary embodiment of the invention.

FIG. 1 to FIG. 8 illustrate cross-sectional views of structures, and FIG. 9 illustrates a cross-sectional view of a semi-finished product 130 obtained during carrying out a method of manufacturing component carriers 150 according to an exemplary embodiment of the invention.

Referring to FIG. 1, a plate-like rigid body of fully cured material 118 is used as a starting point for the manufacturing method. The plate-like body may for instance be embodied as a core manufactured in printed circuit board (PCB) technology. The fully cured material 118 may for example be FR4 material, i.e. cured resin with reinforcing glass fibers therein. The plate-like body may be provided with component carrier panel size (only a section thereof is shown in the figures), for instance with a rectangular shape and a size at least of 12×12 inch$^2$ up to 24×24 inch$^2$. One or more recesses 141 (for example blind holes or through holes) may be formed in the plate-like body as registration markers. Such registration markers are only shown in FIG. 1 and may also be substituted by other optically detectable markers, for instance notches. Thus, the described manufacturing method may start with a pre-hardened core of component carrier (in particular printed circuit board) material.

Figure 2:

Referring to FIG. 2, a plurality of recesses 114 (only one is shown in FIG. 2) or clearances are formed in the panel size plate-like body of fully cured material 118. This may be accomplished for example by milling, laser cutting, punching, or drilling. In the shown embodiment, the recesses 114 are through holes, but can alternatively also be blind holes.

Figure 3:
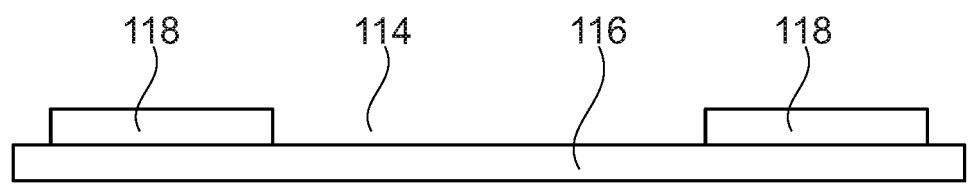

Referring to FIG. 3, a temporary carrier 116 may be attached (for instance adhered or laminated) on a lower main surface of the plate-like body of fully cured material 118 forming part of a layer stack 100 (see FIG. 5) being in the course of manufacture. Temporary carrier 116 may be sticky or adhesive so as to properly adhere to the plate-like body. For example, the temporary carrier 116 may be a carrier tape or a rigid carrier plate. Since it will be removed later (compare the transition from FIG. 6 to FIG. 7) and is provided only to provide adhesion and a temporary support for still uncured bendable material of the presently formed layer stack 100, the carrier 116 is called temporary.

Figure 4:
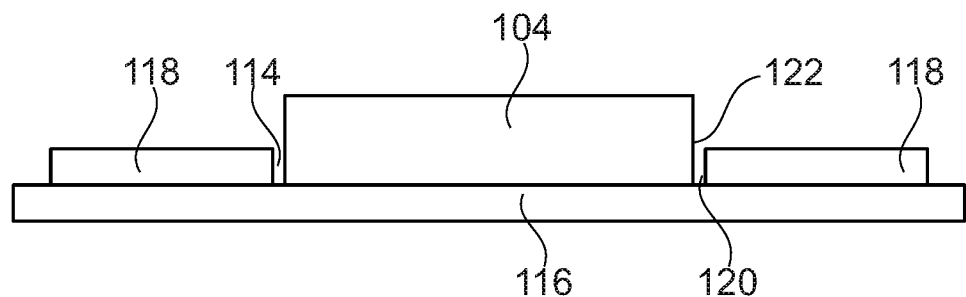

Referring to FIG. 4, a plurality of components 104 (only one is shown in FIG. 4) are inserted in the recesses 114 and are attached onto the sticky temporary carrier 116. Preferably, the components 104 are semiconductor chips with monolithically integrated circuit elements therein. For instance, the components 104 may be bare dies (for example formed in silicon technology) each with at least one integrated circuit element (like a transistor) monolithically integrated therein. Alternatively, it is however also possible to insert a complete semiconductor wafer (or a section thereof including multiple still integrally connected semiconductor chips being not yet singularised) into each of the recesses 114. In the shown embodiment, the components 104 are inserted into the recesses 114 face down, i.e. with chip pads (not shown) in contact with the temporary carrier 116. It is however alternatively also possible that the components 104 are inserted into the recesses 114 face up, i.e. with chip pads facing away from the temporary carrier 116. In yet other exemplary embodiments, the components 104 comprise pads on both opposing main surfaces.

According to the embodiment of FIG. 4, the components 104 vertically protrude beyond the recessed plate-like body of fully cured material 118. It is however alternatively also possible that the components 104 are vertically aligned with the recessed plate-like body of fully cured material 118, or that even the recessed plate-like body of fully cured material 118 vertically protrudes beyond the components 104.

Figure 5:
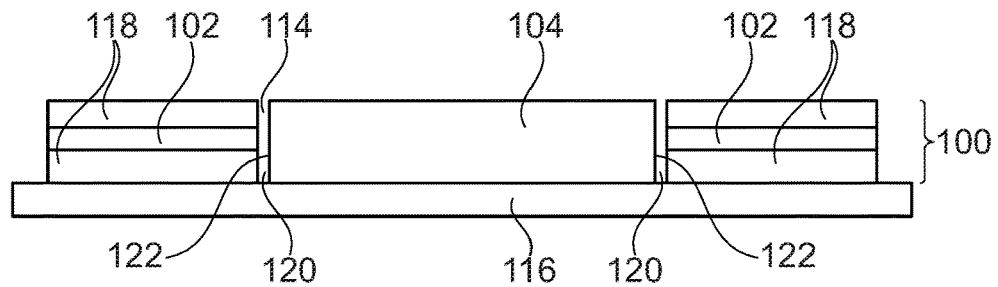

Referring to FIG. 5, formation of the above-mentioned layer stack 100 is completed by stacking a recessed (for instance pre-cut) layer of uncured component carrier material 102 on the recessed plate-like body of fully cured material 118, and by subsequently stacking a further recessed (for instance pre-cut) plate-like body of fully cured material 118 (such as a core) on the recessed layer of uncured component carrier material 102. The recessed layer of uncured component carrier material 102 may for example be made of uncured resin (for instance uncured epoxy resin) with reinforcing particles (for instance glass fibers), such as prepreg. The further recessed plate-like body of fully cured material 118 on the recessed layer of uncured component carrier material 102 may for instance be made of FR4 material. Thus, the recessed layer stack 100 is composed of the layer of uncured component carrier material 102 covered on both opposing main surfaces thereof with fully cured material 118. The height of the layer stack 100 preferably substantially corresponds to the height of the component 104. A small lateral gap 120 remains between the sidewalls of the component 104 and of the recessed layer stack 100.

Figure 6:
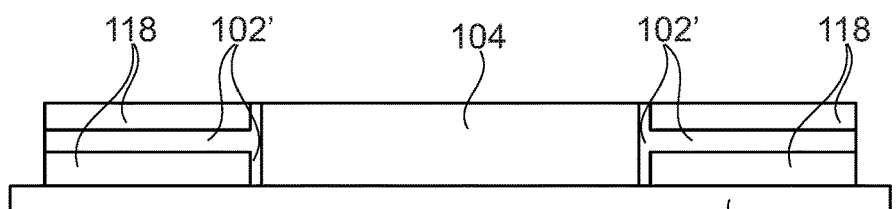

Referring to FIG. 6, the components 104 and the layer stack 100 are integrally connected by curing the uncured component carrier material 102. More specifically, this curing is accomplished by laminating the layer stack 100 with the components 104 by the application of mechanical pressure and thermal energy. As a result, the uncured resin material of the uncured component carrier material 102 melts or becomes flowable, thereby also flows into the gap 120, carries out a chemical cross-linking reaction to thereby become cured, and becomes finally hardened and re-solidified. Thus, the method comprises filling the gaps 120 between a respective one of the components 104 and a respective recess delimiting wall 122 of the layer stack 100 by material of the layer stack 100 cured during the curing. As a consequence of this lamination procedure, the structure shown in FIG. 6 has become rigid, in particular since the previously bendable foil forming the previously uncured component carrier material 102 has become rigid (thus, it is indicated with reference numeral 102' in the following).

Referring to FIG. 7, the temporary carrier 116 is removed after curing the uncured component carrier material 102. In view of the curing, a substantially rigid structure has been obtained so that the temporary carrier 116 is no longer needed as a support for holding the constituents of the structure together. For instance, when embodied as a sticky tape, the temporary carrier 116 may be simply peeled off from the rest of the structure shown in FIG. 6.

Although not shown in the figures, the structure shown in FIG. 7 may then optionally be made subject of a cutting process. For example, a circular section of the rectangular panel may be cut out, for instance by a cutting blade, by mechanically drilling, or by laser processing. Such a cut out circular section (compare FIG. 14 after formation of a redistribution layer 108) may then be denoted as an artificial wafer manufactured in PCB technology and having embedded therein multiple components 104. A circular shape of such a cut out portion may be advantageous for instance when a high temperature robust dielectric structure 106 shall be applied on a main surface of the artificial wafer by spin coating. Thus, the method may—optionally but preferably—further comprise separating a for instance circular section from the cured layer stack 100 with embedded components 104 before forming a high temperature robust dielectric structure 106 (compare FIG. 9).

Referring to FIG. 8, both the components 104 and the layer stack 100 may be vertically thinned after the curing and after removal of the temporary carrier 116. Thinning can be carried out on a top side of the structure shown in FIG. 7, on a bottom side of the structure shown in FIG. 7, or on both sides thereof (also depending on where chip pads are present). For example, thinning may be accomplished by grinding.

Referring to FIG. 9, a high temperature robust dielectric structure 106 is formed on an entire lower surface of the structure shown in FIG. 8 after the thinning. Thus, the dielectric structure 106 is formed on panel level or on artificial wafer level. As shown, the high temperature robust dielectric structure 106 is applied on an entire lower main surface of the cured layer stack 100 with the components 104 therein. Portions of the now cured layer stack 100 laterally separate the components 104 and thereby increase their mutual distance. This is advantageous in terms of the formation of a redistribution layer 108 (of which the high temperature robust dielectric structure 106 forms a part). The latter provides a dimensional transition region between the small electrically conductive structures (in particular chip pads) of the components 104 and the larger electrically conductive structures (in particular PCB pads) of a mounting base such as a further printed circuit board on which one or more singularized component carrier 150 can be assembled or mounted (compare FIG. 13).

For example, the high temperature robust dielectric structure 106 may be applied on the lower main surface of the layer stack 100 and the components 104 by spin coating. Alternatively, the layer-shaped dielectric structure 106 may be formed on the main surface of the layer stack 100 and the components 104 by spray coating, roller coating, slot die coating, or attaching (for example laminating) a dielectric dry film. It is also possible that the dielectric structure 104 is composed of multiple dielectric layers formed or applied one after the other on the main surface of the plate structure composed of the layer stack 100 and the embedded components 104.

In order to form the partially dielectric and partly electrically conductive redistribution layer 108 (which may also be denoted as redistribution structure) on the lower main surface of the layer stack 100 and the embedded components 104, electrically conductive structures 110 are inserted or formed in the high temperature robust dielectric structure 106 so as to electrically connect the components 104 with an exposed surface of the redistribution layer 108. As can be taken from FIG. 9, electrically conductive sections 111 of the electrically conductive structures 110 contacting the pads on the lower main surface of the components 104 may have smaller lateral dimensions as compared to larger lateral dimensions of electrically conductive sections 113 of the electrically conductive structure 110 exposed at a lower main surface of semi-finished product 130 shown in FIG. 9 (compare detail 115). This relaxes the requirements in terms of spatial accuracy and pitch size when surface mounting one of the component carriers 150 after completion manufacture thereof on a mounting base such as a printed circuit board. Thus, each of the components 104 can be laterally surrounded with component carrier material of layer stack 100 to thereby increase the surface of the component 104 for redistribution by redistribution layer 106 extending over the entire main surface of the readily manufactured component carriers 150 (see FIG. 13).

In a modification, which can be applied to any of the disclosed embodiments, the electrically conductive sections 113 can be omitted, and electrically conductive sections 111, which contact the pads on the lower main surface of the component 104, can have a different or larger pitch than the pitch of the pads on the lower main surface of the component 104. Thereby, a redistribution structure can be formed directly at the component 104. The electrically conductive sections 111 can be formed by providing a wet or dry seed layer, such as by ALD, PVD like sputtering, electroless plating, and by subsequently electroplating on the seed layer.

In a further development of any of the disclosed embodiments, at least one further layer is applied on the redistribution layer 108, in particular with a further component embedded therein.

In order to complete formation of the component carriers 150, the manufacturing method may further comprise singularizing the layer stack 100 with the inserted components 104 and the redistribution layer 108 thereon into a plurality of component carriers 150 each comprising an inserted component 104, a portion of the layer stack 100 and a portion of the redistribution layer 108 including a portion of the high temperature robust dielectric layer 106. Singularization may be carried out by cutting the panel sized or wafer sized structure shown in FIG. 9 at cutting lines 153. For instance, this cutting procedure may be carried out by mechanical cutting, laser cutting or chemical cutting.

The entire structure shown in FIG. 9 (i.e., before singularization) forms a semi-finished product 130 according to an exemplary embodiment of the invention comprising the laminated layer stack 100 made of PCB material, the multiple semiconductor components 104 arranged in recesses 114 of the layer stack 100, and the high temperature robust redistribution layer 108 on one main surface of the layer stack 100 and electrically coupled with the semiconductor components 104 as well as forming an exterior electrical interface by the electrically conductive structures 110. In other words, the redistribution layer 108 comprises the electrically conductive structure 110 having electrically conductive areas on an exposed surface of the redistribution layer 108 which areas are larger than areas of pads of the semiconductor components 104. As described, the redistribution layer 108 comprises a high temperature robust dielectric structure 106 made of a material such as thermostable polyimide capable of withstanding temperatures of 300° C. or more. Thus, the high temperature robust dielectric material 134 and consequently the entire redistribution layer 108 is capable of withstanding high temperatures without damage. Hence, undesired phenomena (such as blistering, fissures, delamination, warpage) which may occur after mounting a component carrier 150 singularized from the semi-finished product 130 on a mounting base such as a PCB may be strongly suppressed or even eliminated. This holds both during critically manufacturing processes such as laser drilling or reflow soldering, as well as during critical operation of a readily manufactured component carrier 150 in a large temperature range between high temperatures and low temperatures in which significant thermal stress is applied which however the component carrier 150 can withstand.

Each of these singularized component carriers 150 may comprise one (or more) of the semiconductor components 104 laterally surrounded by component carrier material 138 (in particular printed circuit board material such as FR4) in the form of a section of layer stack 100. In other words, component carrier material 138 laterally surrounds the semiconductor component 104. Furthermore, each singularized component carrier 150 may comprise a redistribution structure 132 as a portion of the redistribution layer 108 of the semi-finished product 130. The redistribution structure 132 has a fan-out configuration and laterally extends beyond the component 104, therefore also covering a portion of the printed circuit board material. The redistribution structure 132 is composed of high temperature robust dielectric material 134 and electrically conductive structures 110 inserted, embedded or formed therein. The redistribution structure 132 can comprise any dielectric material or any material which is disclosed herein with respect to the electrically insulating layer structures. The component carrier material 138 surrounds the semiconductor component 104 only in a lateral direction while a top surface of the semiconductor component 104 remains exposed. Redistribution structure 132 entirely covers the bottom main surface of both the semiconductor component 104 and the component carrier material 138. As can be taken from FIG. 9, the electrically conductive structures 110 are externally exposed and are electrically coupled with pads 136 of the semiconductor component 104.

Figure 10:
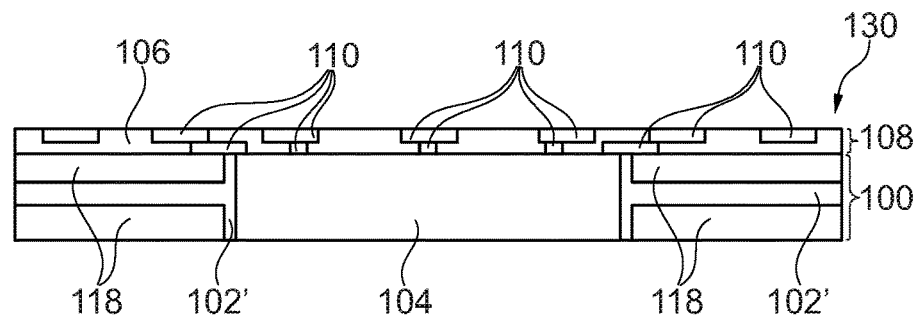
FIG. 10 and FIG. 11 illustrate cross-sectional views of a semi-finished product and a component carrier obtained during carrying out a method of manufacturing component carriers according to another exemplary embodiment of the invention.
Figure 11:
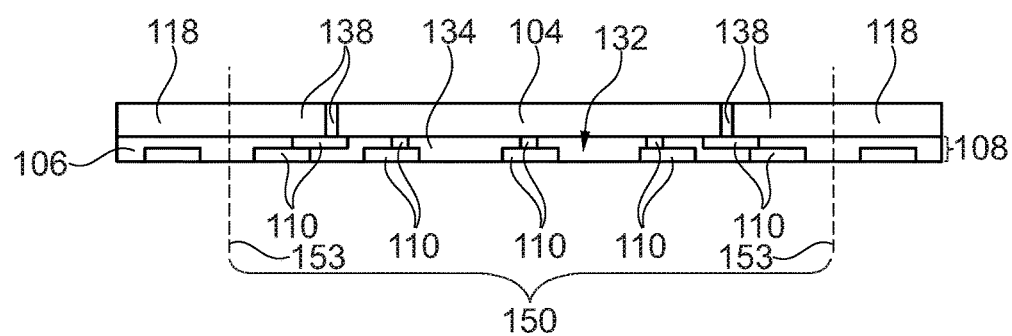

FIG. 10 and FIG. 11 illustrate cross-sectional views of a semi-finished product 130 and a component carrier 150 obtained during carrying out a method of manufacturing component carriers 150 according to another exemplary embodiment of the invention. In this alternative manufacturing method, the procedures described above referring to FIG. 1 to FIG. 7 may be carried out in the same way. Based on the structure shown in FIG. 7, the alternative manufacturing method however proceeds as described in the following.

Referring to FIG. 10, the redistribution layer 108 extending along one entire main surface of the panel or artificial wafer and including the high temperature robust dielectric structure 106 is formed before carrying out a thinning procedure (rather than after carrying out a thinning procedure, as in FIG. 8 and FIG. 9). As a result, semi-finished product 130 shown in FIG. 10 is obtained.

Referring to FIG. 11, the semi-finished product 130 according to FIG. 10 may then be thinned by removing (in particular by grinding) material from the lower main surface of the semi-finished product 130 according to FIG. 10. Subsequently, the thinned semi-finished product 130 may be singularized by cutting along cutting lines 153, to thereby obtain individual component carriers 150 according to an exemplary embodiment of the invention.

Figure 12:
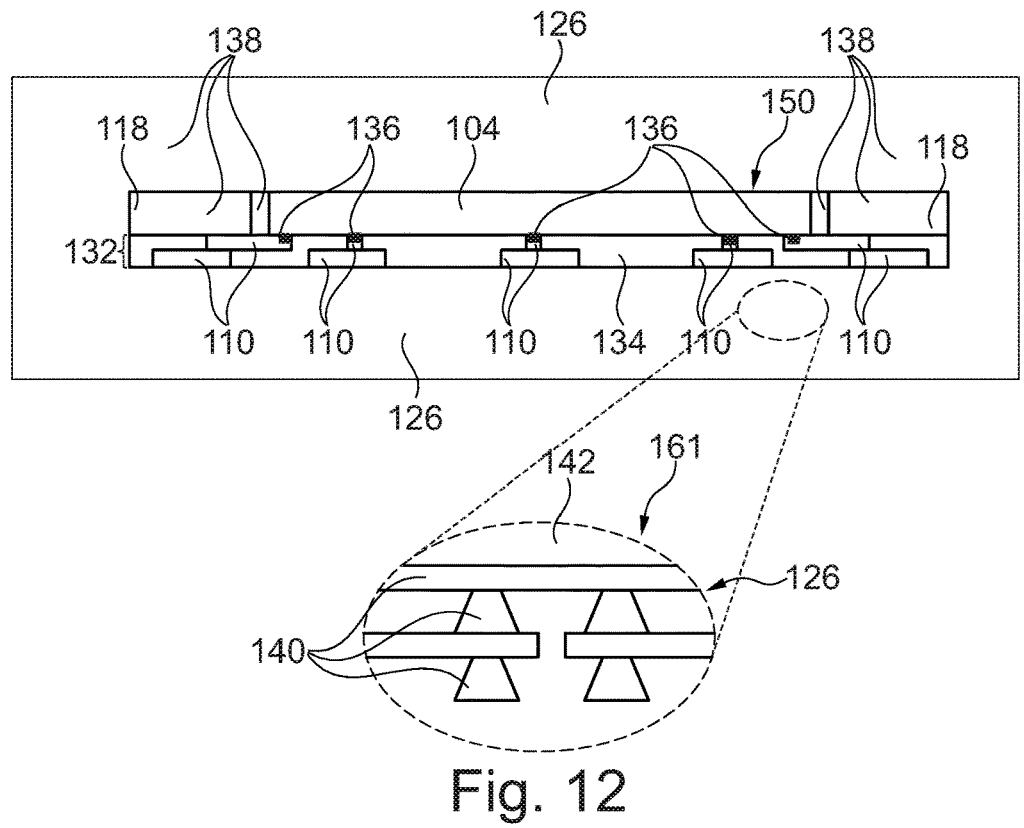
FIG. 12 illustrates a cross-sectional view of a component carrier according to an exemplary embodiment of the invention in a board-in-board configuration.

FIG. 12 illustrates a cross-sectional view of a component carrier 150 according to an exemplary embodiment of the invention.

The component carrier 150 according to FIG. 12 can be obtained by embedding the structure according to FIG. 11 in further component carrier material 126. The component carrier 150 according to FIG. 12 can also be denoted as a board-in-board device. A detail 161 of the further component carrier material 126 shows that the latter can be composed of a plurality of electrically insulating layer structures 142 and a plurality of electrically conductive layer structures 140. For instance, the electrically insulating layer structures 142 may comprise resin with reinforcing particles (such as prepreg or FR4). The electrically conductive layer structures 140 may be copper structures. They may comprise complete copper layers, patterned copper layers and/or vertical interconnects (such as copper vias).

As can be taken from FIG. 12, the electrically conductive structures 110 in the redistribution structure 132 are electrically coupled with pads 136 on the semiconductor component 104.

The redistribution structure 132, which forms a kind of transmission area between the component 104 and a main surface of the component carrier 150, includes the electrically conductive layer structures 140 which cannot be formed in conventional semiconductor technologies such as so-called wafer-level packaging processes (WLP, FOWLP, etc).

Figure 13:
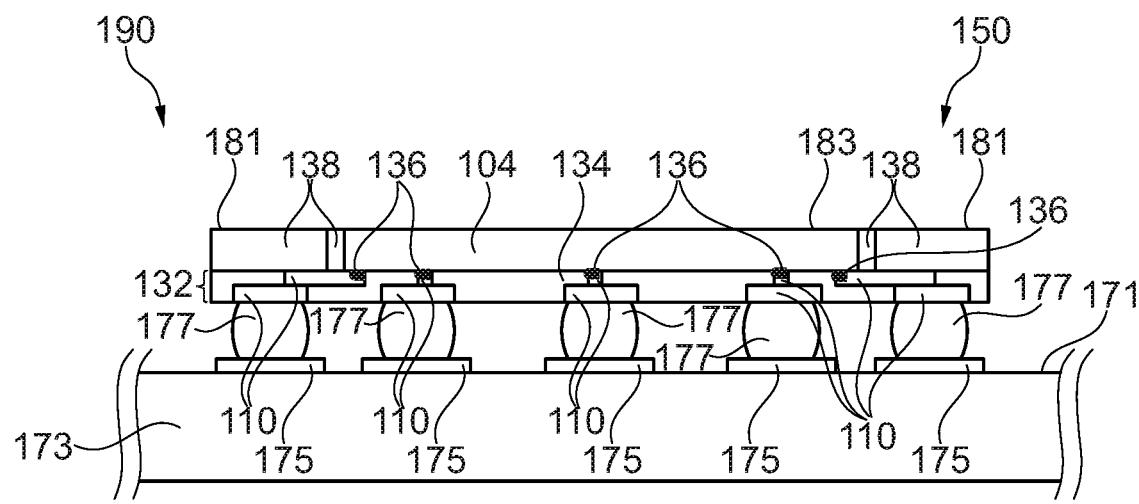
FIG. 13 illustrates a cross-sectional view of an electronic device comprising a component carrier mounted on a mounting base according to an exemplary embodiment of the invention.

FIG. 13 illustrates a cross-sectional view of an electronic device 190 with a component carrier 150 according to another exemplary embodiment of the invention.

According to FIG. 13, the component carrier 150 is mounted on a mounting surface 171 of a mounting base 173, such as a printed circuit board (PCB). More precisely, exterior exposed portions of the electrically conductive structure 110 of the redistribution structure 132 are electrically and mechanically connected with pads 175 of the mounting base 173 by solder structures 177, in particular solder balls. Soldering may involve high temperature reflow soldering without harming the redistribution structure 132.

FIG. 13 also shows that exposed main surfaces 181, 183 of the component carrier material 138 and of the semiconductor component 104 are aligned so as to form a common planar step-free area. The component carrier 150 may thus be manufactured as a flat plate-like body with high compactness and proper shape match with a plate-like mounting base 173 such as a PCB.

In the embodiment of FIG. 13, the layer stack 100 with the inserted components 104 and the high temperature robust dielectric structure 106 is mounted on the mounting base 173, in particular a printed circuit board. In a modification, the layer stack 100 with the inserted components 104 and the high temperature robust dielectric structure 106 can be embedded into the mounting base 173, in particular a printed circuit board.

Figure 14:
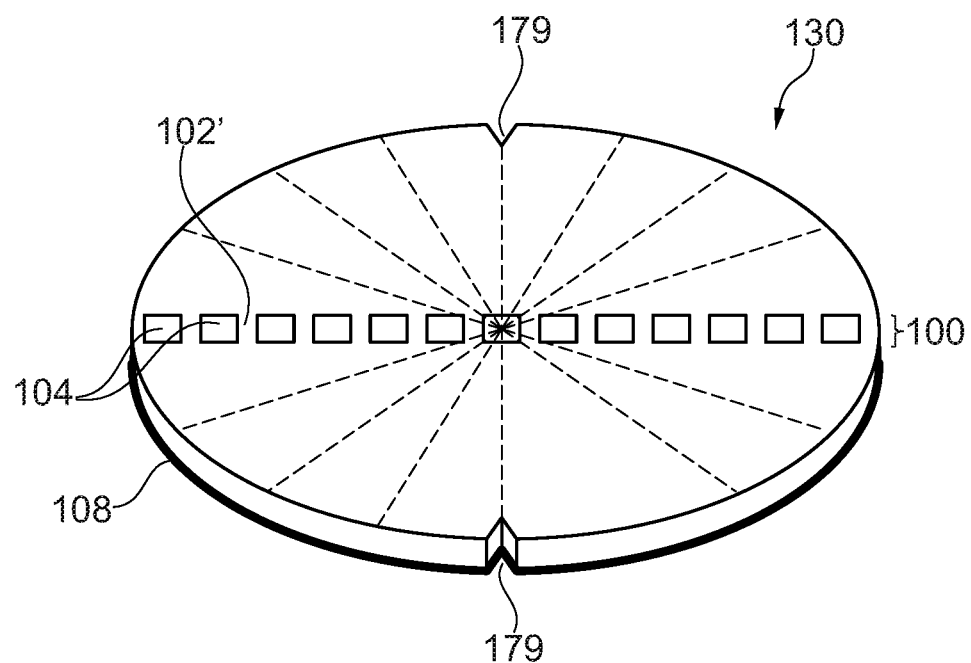
FIG. 14 illustrates a three-dimensional view of a semi-finished product, configured as artificial circular wafer in printed circuit board technology, obtained during carrying out a method of manufacturing component carriers according to an exemplary embodiment of the invention.

FIG. 14 illustrates a three-dimensional view of a semi-finished product 130, configured as artificial circular wafer in printed circuit board (PCB) technology, obtained during carrying out a method of manufacturing component carriers 150 according to another exemplary embodiment of the invention. Thus, FIG. 14 shows a three-dimensional view of the semi-finished product 130 similar to FIG. 9 or FIG. 10 shaped as a circular disk or artificial wafer. For the sake of simplicity, only some of the embedded components 104 are shown (they may for instance be arranged in rows and columns, i.e. in a matrix like pattern, in a main surface of the semi-finished product 130. Optional registration notches 179 are shown as well.

Figure 15:
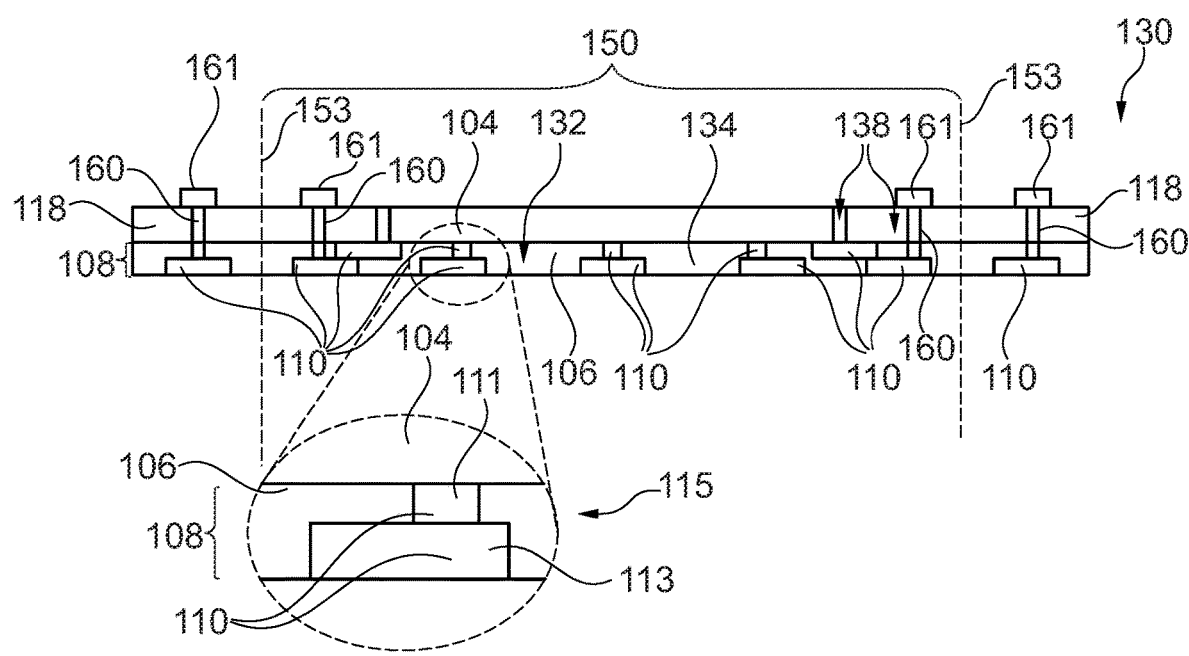
FIG. 15 illustrates a further development of the embodiment in FIG. 9 according to another exemplary embodiment of the invention.

FIG. 15 illustrates a further development of the embodiment in FIG. 9 according to another exemplary embodiment of the invention. In the semi-finished product 130, a plurality of vertical through connections 160 extends between two opposing main surfaces of and through the component 104. The vertical through connections 160 can be vias or so called through-silicon-vias (TSV). The vertical through connections 160 can comprise an electrically conductive or heat conductive material such as copper, aluminum, silver, gold, etc. The vertical through connections 160 can be solid or hollow such as a pipe. The vertical through connections 160 may have a function to conduct electricity and/or to conduct heat in order to achieve a heat transfer from the component 104.

The vertical through connections 160 can be connected to the electrically conductive structures 110 so that the vertical through connections 160 penetrate the semi-finished product 130. It is further possible to guide a connection path from the pads on one main surface, i.e. on the lower main surface, of the component 104 to another main surface, i.e. the upper main surface, of the component 104.

The vertical through connections 160 an be formed by etching, in particular ion etching, through holes in the component 104 and by subsequently filling the through holes by the electrically conductive or heat conductive material such as copper. Alternatively, instead of etching, the through holes can be formed by at least one of mechanical drilling and laser drilling.

Pads 161 being aligned and connected to the vertical through connections 160 can be formed on the main surface of the component 104 by the electrically conductive or heat conductive material such as copper. The pads 161 can be formed by conventional patterning processes.

In a further development of the embodiment of FIG. 15, another high temperature robust dielectric structure can be applied on another main surface of the cured layer stack 100, and another redistribution layer can be formed on the other main surface at which the other high temperature robust dielectric structure is arranged, wherein the other high temperature robust dielectric structure forms part of the other redistribution layer.

It should be noted that the term "comprising" does not exclude other elements or steps and the "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier being singularized from a semi-finished product, the semi-finished product comprising:
   a laminated layer stack made of component carrier material;
   a plurality of semiconductor components arranged in recesses of the layer stack, wherein the semiconductor components are bare dies;
   a redistribution layer on a main surface of the layer stack and electrically coupled with the semiconductor components; wherein at least one of the semiconductor components and the layer stack is thinned;
   a component carrier comprising:
      a semiconductor component;
      the semiconductor component with the component carrier material at least partially surrounding the semiconductor component only in a lateral direction;
      a redistribution structure entirely covering one main surface of the semiconductor components and of the component carrier material and comprising a high temperature robust dielectric material and electrically conductive structures therein,
      wherein the electrically conductive structures are externally exposed and are electrically coupled with pads of the semiconductor component.

2. The component carrier according to claim 1, comprising at least one of the following features:
   wherein the redistribution layer comprises a high temperature robust dielectric material selected from the group consisting of an aromatic polyimide Polybenzoxazole, Benzocyclobutane, cyanate ester, and a blend with high temperature epoxy materials;
   wherein the redistribution layer comprises an electrically conductive structure having electrically conductive areas on an exposed surface of the redistribution layer which areas are larger than areas of pads of the semiconductor components;
wherein the semiconductor component is a bare die with at least one integrated circuit element monolithically integrated therein.

3. The component carrier according to claim 1, further comprising at least one of the following features:
wherein the high temperature robust dielectric material is thermostable at least up to a temperature of 250° C.;
wherein exposed main surfaces of the component carrier material and of the semiconductor component are aligned so as to form a common planar area;
wherein the redistribution structure is configured for electrically connecting the semiconductor component with a fan-out layout;
wherein the component carrier is shaped as a plate;
wherein the component carrier is configured as one of the group consisting of a printed circuit board, and a substrate;
wherein the component carrier is configured as a laminate-type component carrier;
at least one further layer is applied on the redistribution layer with a further component embedded therein.

4. The component carrier according to claim 1, wherein at least one vertical through connection extends between two opposing main surfaces of and through the semiconductor component.

5. The component carrier according to claim 4,
wherein another high temperature robust dielectric structure is applied on another main surface of the cured layer stack, and
another redistribution layer is formed on the other main surface at which the other high temperature robust dielectric structure is arranged,
wherein the other high temperature robust dielectric structure forms part of the other redistribution layer.

6. The component carrier according to claim 5, wherein another component is embedded in the other redistribution layer.

7. An electronic device, comprising:
a mounting base arranged as a printed circuit board;
a component carrier mounted on and electrically coupled with the mounting base by a solder structure, the component carrier including:
a semiconductor component with a component carrier material at least partially surrounding the semiconductor component only in a lateral direction;
a redistribution structure entirely covering one main surface of the semiconductor component and of the component carrier material and comprising a high temperature robust dielectric material and electrically conductive structures therein,
wherein the electrically conductive structures are externally exposed and are electrically coupled with pads of the semiconductor component.

8. An electronic device, comprising:
a mounting base arranged as a printed circuit board;
a component carrier embedded in and electrically coupled with the mounting base by a solder structure, the component carrier including:
a semiconductor component with a component carrier material at least partially surrounding the semiconductor component only in a lateral direction;
a redistribution structure entirely covering one main surface of the semiconductor component and of the component carrier material and comprising a high temperature robust dielectric material and electrically conductive structures therein,
wherein the electrically conductive structures are externally exposed and are electrically coupled with pads of the semiconductor component.

9. A manufacturing method, wherein the method comprises:
providing a layer stack comprising at least partially uncured component carrier material;
arranging a plurality of semiconductor components in recesses of the layer stack, wherein the semiconductor components are bare dies;
integrally connecting the components with the layer stack by curing the component carrier material;
after the curing, thinning at least one of the components and the layer stack; and
applying a high temperature robust dielectric structure on a main surface of the cured layer stack with the components therein.

10. The method according to claim 9, wherein the method further comprises:
forming a redistribution layer on the main surface at which the high temperature robust dielectric structure is arranged, wherein the high temperature robust dielectric structure forms part of the redistribution layer.

11. The method according to claim 10, wherein the method further comprises:
forming electrically conductive structures in the high temperature robust dielectric structure of the redistribution layer for electrically connecting the components with an exposed surface of the redistribution layer.

12. The method according to claim 9, wherein the high temperature robust dielectric structure is applied on the main surface of the layer stack with the components therein by one of the group consisting of spin coating, spray coating, roller coating, slot die coating, and attaching a dry film.

13. The method according to claim 9, wherein the method further comprises:
forming the layer stack with a component carrier panel size in a range between 12×12 inch$^2$ and 24×24 inch$^2$.

14. The method according to claim 9, wherein the method further comprises:
separating a circular section from the layer stack before forming the high temperature robust dielectric structure.

15. The method according to claim 9, wherein the method further comprises:
forming the recesses by at least one selected from the group consisting of milling, laser cutting, punching, and drilling.

16. The method according to claim 9, wherein the method further comprises:
attaching a temporary carrier on a main surface of the layer stack;
subsequently inserting the components in the recesses and attaching them onto the temporary carrier, and
removing the temporary carrier after curing the at least partially uncured component carrier material.

17. The method according to claim 9, further comprising at least one of the following features:
providing the at least partially uncured component carrier material covered on both opposing main surfaces with fully cured material as part of the layer stack or as the entire layer stack;
wherein curing is accomplished by laminating by the application of at least one of mechanical pressure and thermal energy;

at least partially filling gaps between a respective component and a recess delimiting wall of the layer stack by material of the layer stack cured during the curing;

wherein forming the high temperature robust dielectric structure is carried out before the thinning or after the thinning;

singularizing the layer stack with the inserted components and the high temperature robust dielectric structure, the redistribution layer comprising the high temperature robust dielectric structure thereon into a plurality of component carriers each comprising an inserted component, embedding at least one of the component carriers in further component carrier material;

embedding the layer stack with the inserted components and the high temperature robust dielectric structure into a mounting base;

applying at least one further layer on the redistribution layer with embedding a further component into the at least one further layer.

18. The method according to claim 9, further comprising:

forming at least one vertical through connection extending between two opposing main surfaces of and through the component.

19. The method according to claim 18, further comprising:

applying another high temperature robust dielectric structure on another main surface of the cured layer stack and forming another redistribution layer on the other main surface at which the other high temperature robust dielectric structure is arranged, wherein the other high temperature robust dielectric structure forms part of the other redistribution layer.

20. The method according to claim 19, further comprising:

embedding another component in the other redistribution layer.

* * * * *